United States Patent
Hao et al.

(10) Patent No.: US 12,008,832 B2
(45) Date of Patent: Jun. 11, 2024

(54) DISPLAY MODULE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Xiaodong Hao, Beijing (CN); Kang Wang, Beijing (CN); Danyang Bi, Beijing (CN); Wei Chen, Beijing (CN); Wei Gong, Beijing (CN); Xiangdong Wei, Beijing (CN); Renzhe Xu, Beijing (CN); Yi Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/800,544

(22) PCT Filed: Nov. 17, 2021

(86) PCT No.: PCT/CN2021/131075
§ 371 (c)(1),
(2) Date: Aug. 18, 2022

(87) PCT Pub. No.: WO2022/179198
PCT Pub. Date: Sep. 1, 2022

(65) Prior Publication Data
US 2023/0068253 A1   Mar. 2, 2023

(30) Foreign Application Priority Data

Feb. 24, 2021   (CN) .......................... 202110209454.X

(51) Int. Cl.
*G06V 40/13*      (2022.01)
*H10K 59/126*     (2023.01)

(52) U.S. Cl.
CPC ....... *G06V 40/1306* (2022.01); *H10K 59/126* (2023.02)

(58) Field of Classification Search
None
See application file for complete search history.

(56) References Cited

U.S. PATENT DOCUMENTS

| 2010/0053118 A1 | 3/2010 | Chen |
| 2019/0073505 A1* | 3/2019 | Kwon ................ G06V 40/1306 |

(Continued)

FOREIGN PATENT DOCUMENTS

| CN | 106940488 A | 7/2017 |
| CN | 207731291 U | 8/2018 |

(Continued)

OTHER PUBLICATIONS

International Search Report for PCT/CN2021/131075 dated Feb. 23, 2022.

*Primary Examiner* — Joseph R Haley
(74) *Attorney, Agent, or Firm* — Ling Wu; Stephen Yang; Ling and Yang Intellectual Property

(57) ABSTRACT

A display module and a display device are disclosed. The display module includes a display panel, a heat dissipation film disposed on a side of the display panel facing away from a display side, and an ultrasonic fingerprint module. The heat dissipation film is provided with a first opening, and the ultrasonic fingerprint module includes a sensor disposed within the first opening and fixed on the side of the display panel facing away from the display side by a shading adhesive layer. The display module further includes a light shielding sheet attached on a side of the heat dissipation film facing away from the display panel. The light shielding sheet is provided with a second opening which exposes the sensor. An orthographic projection of the light shielding sheet and (Continued)

the shading adhesive layer on the display panel includes an orthographic projection of the first opening on the display panel.

15 Claims, 3 Drawing Sheets

(56) References Cited

U.S. PATENT DOCUMENTS

| | | | |
|---|---|---|---|
| 2020/0358891 A1* | 11/2020 | Heo | H04M 1/026 |
| 2021/0271841 A1* | 9/2021 | Chen | G02B 7/022 |
| 2022/0376202 A1 | 11/2022 | Yang et al. | |

FOREIGN PATENT DOCUMENTS

| | | |
|---|---|---|
| CN | 111428584 A | 7/2020 |
| CN | 111785175 A | 10/2020 |
| CN | 111867342 A | 10/2020 |
| IN | 112861761 A | 5/2021 |

* cited by examiner

DISPLAY MODULE AND DISPLAY DEVICE

CROSS-REFERENCE TO RELATED APPLICATIONS

The present application is a U.S. National Phase Entry of International Application PCT/CN2021/131075 having an international filing date of Nov. 17, 2021, which claims priority of Chinese Patent Application No. 202110209454.X, entitled "Display Module and Display Device", filed on Feb. 24, 2021 with the China National Intellectual Property Administration (CNIPA), and the contents disclosed in the above-mentioned applications are hereby incorporated as a part of this application.

TECHNICAL FIELD

Embodiments of the disclosure relate to, but are not limited to, the technical field of display devices, and more particularly to a display module and a display device.

BACKGROUND

At present, fingerprint identification technologies has been widely used in many fields, such as mobile phones, tablets, smart door locks and so on. As a third generation fingerprint identification technology, ultrasonic fingerprint identification technology has strong environmental adaptability, and is less affected by finger dirt, grease and water stains. Even if a finger has water and dirt, a fingerprint can be accurately identified with a high rate of identification. When the ultrasonic fingerprint identification technology is applied to display products, it is necessary to give attention to both display performance and fingerprint identification performance of display products.

SUMMARY

The following is a summary of subject matter described herein in detail. The summary is not intended to limit the protection scope of claims.

A display module is provided in an embodiment of the present disclosure, which includes a display panel, a heat dissipation film disposed on a side of the display panel facing away from a display side, and an ultrasonic fingerprint module. The heat dissipation film is provided with a first opening, and the ultrasonic fingerprint module includes a sensor disposed within the first opening and fixed on the side of the display panel facing away from the display side by a shading adhesive layer. The display module further includes a light shielding sheet attached on a side of the heat dissipation film facing away from the display panel. The light shielding sheet is provided with a second opening which exposes the sensor. An orthographic projection of the light shielding sheet and the shading adhesive layer on the display panel includes an orthographic projection of the first opening on the display panel.

A display device is further provided in an embodiment of the present disclosure, which includes the display module described in any of the aforementioned embodiments.

Other aspects may be understood upon reading and understanding the drawings and the Detailed description.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of various components in the drawings do not reflect actual scales, and are only intended to schematically illustrate the contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

Figure 1:
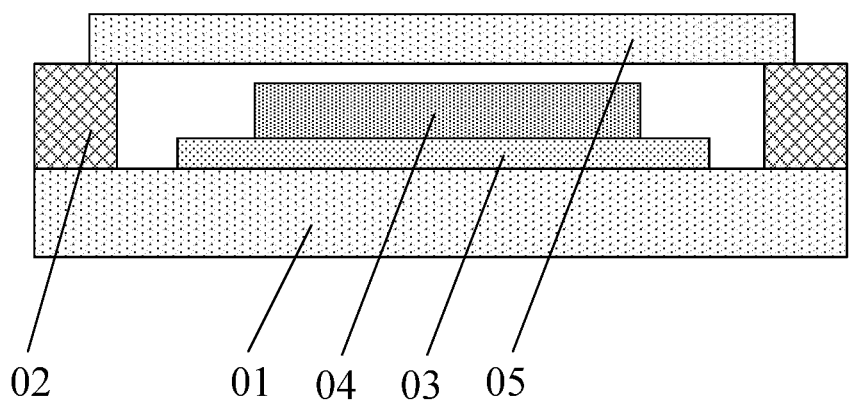
FIG. 1 illustrates schematically a partial cross-sectional view of a structure of a display module in some related arts.
Figure 2:
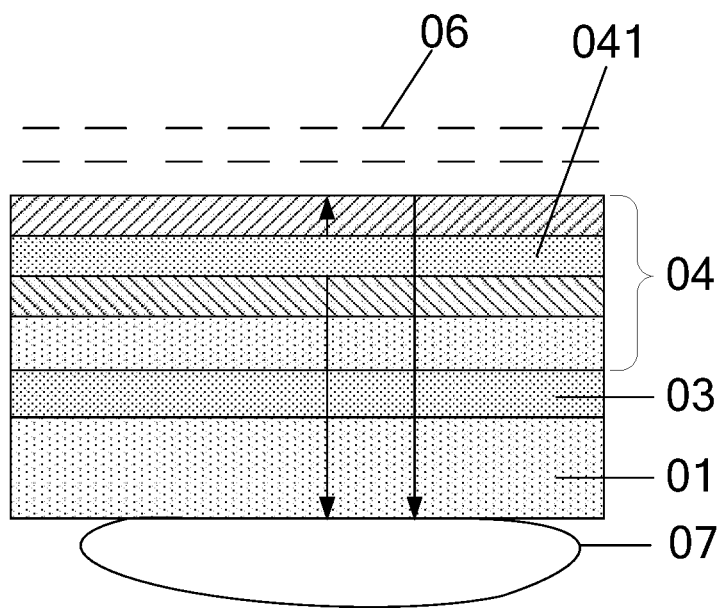
FIG. 2 is a schematic diagram of a path of ultrasonic waves emitted by the ultrasonic fingerprint module in FIG. 1.

In some display modules (such as OLED display modules) to which ultrasonic fingerprint identification technology is applied, as shown in FIG. 1, FIG. 1 illustrates schematically a partial cross-sectional view of a structure of a display module using the ultrasonic fingerprint identification technology, a heat dissipation film 02, such as a Super Clean Foam (SCF), is attached at a side of a display panel 01 facing away from the display side. Because the SCF contains a metal layer, in order to avoid affecting the normal operation of an ultrasonic Fingerprint Sensor (FPS), the SCF is employed with a design of an opening for attaching the ultrasonic fingerprint module. Considering shapes and attachment tolerance of the ultrasonic fingerprint module and an adhesive layer 03 for attachment, the opening of the SCF is generally much larger than a boundary of a sensor 04 of the ultrasonic fingerprint module, which leads to a problem of light leakage and affects an integrated black effect of the product. To avoid the light leakage, in some technologies, a light shielding sheet 05 is attached to a whole surface of the opening of the SCF. However, the attached ultrasonic fingerprint module results in a small thickness difference between a total thickness of the sensor 04 of the ultrasonic fingerprint module and the adhesive layer 03 for attaching and a thickness of the SCF, and due to its own gravity, the light shielding sheet 05 attached to the whole surface of the opening of the SCF collapses or contact with external things, resulting in contact with a surface of the sensor 04 of the ultrasonic fingerprint module. As shown in FIG. 2, FIG. 2 is a schematic diagram of a path of ultrasonic waves emitted by the sensor of the ultrasonic fingerprint module in FIG. 1, straight lines with arrows in FIG. 2 represent propagation paths of the ultrasonic waves. In practice, for the sensor 04 of the ultrasonic fingerprint module, ultrasonic signals generated by an emitting layer 041 are simultaneously emitted to both sides (upper and lower sides of the emitting layer 041 in FIG. 2), wherein ultrasonic signals to a side facing away from the adhesive layer 03 are reflected on a surface of the sensor 04 in contact with air 06 (an upper surface of the sensor 04 is shown in FIG. 2, and a finger 07 is identified on an lower surface of the display panel 01 in FIG. 2). The air 06 may provide a better reflective imaging background. If the surface of sensor 04 in contact with the air 06 is partially in contact with other materials, neither an imaging background of the ultrasonic fingerprint module is affected, nor is identification performance of the ultrasonic fingerprint module affected in turn. Therefore, in the display module shown in FIG. 1, after the light shielding sheet 05 is attached to the whole surface of the opening of the SCF, the light shielding sheet 05 contacts with the surface of the sensor 04, thus affecting identification performance of the ultrasonic fingerprint module.

Figure 3:
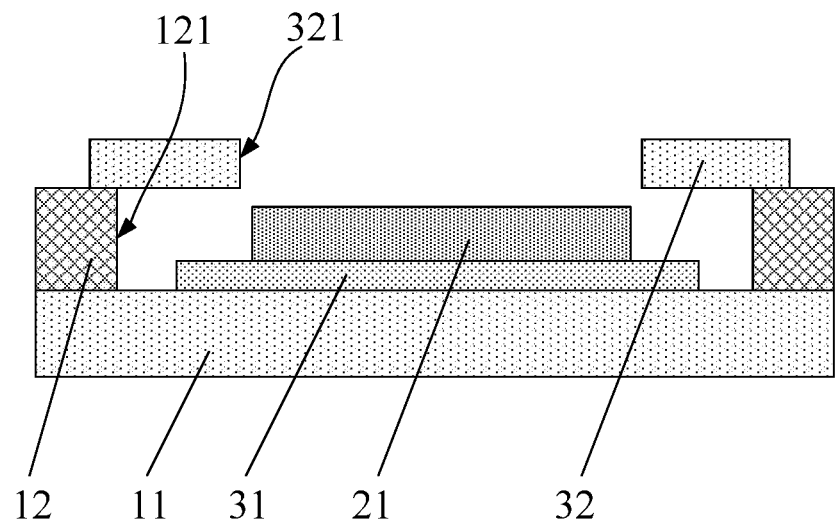
FIG. 3 illustrates schematically a partial cross-sectional view of a structure of a display module according to some exemplary embodiments.
Figure 4:
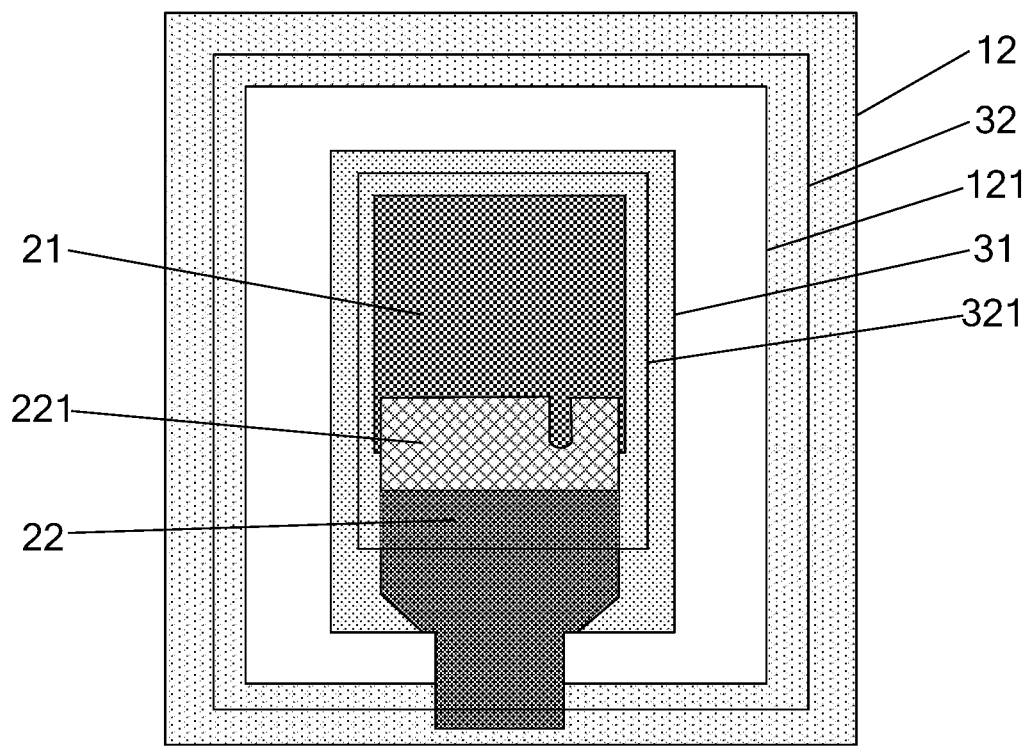
FIG. 4 illustrates schematically of a partial top view of a structure of the display substrate in FIG. 3.

A display module is provided in an embodiment of the present disclosure. In some exemplary embodiments, as shown in FIGS. 3 and 4, the display module includes a display panel 11, a heat dissipation film 12 disposed on a side of the display panel 11 facing away from a display side, and an ultrasonic fingerprint module. The heat dissipation film 12 is provided with a first opening 121, and the ultrasonic fingerprint module includes a sensor 21, wherein the sensor 21 is disposed within the first opening 121 and fixed on the side of the display panel 11 facing away from the display side by a shading adhesive layer 31. The display module further includes a light shielding sheet 32 attached on a side of the heat dissipation film 12 facing away from the display panel 11. The light shielding sheet 32 is provided with a second opening 321, wherein the second opening 321 exposes the sensor 21. An orthographic projection of the light shielding sheet 32 and the shading adhesive layer 31 on the display panel 11 includes an orthographic projection of the first opening 121 on the display panel 11.

According to the display module of the embodiment of the present disclosure, the light shielding sheet 32 is provided with a second opening 321, wherein the second opening 321 exposes the sensor 21 of the ultrasonic fingerprint module, therefore, the light shielding sheet 32 does not contact with the sensor 21 of the ultrasonic fingerprint module, neither the imaging background of the ultrasonic fingerprint module is affected, nor the identification performance of the ultrasonic fingerprint module is affected in turn. Furthermore, the orthographic projections of the light shielding sheet 32 and the shading adhesive layer 31 on the display panel 11 includes the orthographic projection of the first opening 121 of the heat dissipation film 12 on the display panel 11, thereby completely covering a surface of the display panel 11 exposed by the first opening 121, avoiding an risk of light leakage and scratching, and ensuring the integrated black effect.

In some exemplary embodiments, as shown in FIGS. 3 and 4, a circumferential edge of the shading adhesive layer 31 protrudes from the sensor 21, and an area of the light shielding sheet 32 close to the second opening 321 is attached to a portion of the shading adhesive layer 31 protruding from the sensor 21. In this example, the light shielding sheet 32 and the shading adhesive layer 31 are partially overlapped, so that the surface of the display panel 11 exposed by the first opening 121 can be better completely covered and the risk of light leakage can be avoided.

In some exemplary embodiments as shown in FIGS. 3 and 4, there is a gap between the circumferential edge of the shading adhesive layer 31 and a wall of the first opening 121. In this example, an area where the first opening 121 of the heat dissipation film 12 is located is larger than an area where the sensor 21 and the shading adhesive layer 31 are located, which facilitates the mounting of the sensor 21.

In some exemplary embodiments, the light shielding sheet 32 may be a lightproof adhesive tape or other opaque film material. The shading adhesive layer 31 may be a Pressure Sensitive Adhesive (PSA) or another kind of viscose.

In some exemplary embodiments, a thickness of the heat dissipation film 12 is d1, and a total thickness of the sensor 21 and the shading adhesive layer 31 is d2, where d1>d2, and a difference between d1 and d2 ranges from 0.03 mm to 0.15 mm. As an example, d1 may be 0.18 mm to 0.3 mm and d2 may be about 0.15 mm.

In some exemplary embodiments, the heat dissipation film 12 may be an SCF, and the heat dissipation film 12 may include an adhesive layer, a buffer layer, and a metal layer stacked in sequence, wherein the adhesive layer is bonded to the side of the display panel 11 facing away from the display side. As an example, the adhesive layer may be an EMBO adhesive layer, and an adhesive surface of the adhesive layer may be formed with vertical and horizontal reticulations by imprinting, which may prevent the adhesive layer from curling and may improve adhesion. A material of the adhesive layer may be acrylic or silica gel. A material of the buffer layer may be foam, which can buffer external force and play a role in shading light. A material of the metal layer may be copper or aluminum or the like, to impart good heat dissipation effect to the heat dissipation film 12.

In some exemplary embodiments, as shown in FIG. 4, a shape of the first opening 121 may be a circle, a rectangle or an ellipse, etc. The shape of the first opening 121 and a shape of the second opening 321 may be adapted to a shape of the sensor 21 of the ultrasonic fingerprint module.

In some exemplary embodiments, the display module may further include a polarizer and a cover plate sequentially stacked on the display side of the display panel, wherein the polarizer and the display panel may be bonded by an optical transparent adhesive, and the polarizer and the cover plate may be bonded by an optical transparent adhesive. The heat dissipation film may be attached to the surface of the display panel facing away from the display side, or the surface of the display panel facing away from the display side may be attached with a back film or other auxiliary film layer, and the heat dissipation film may be attached to a surface of the back film or other auxiliary film layer facing away from the display panel. The display panel may include a base substrate, and a circuit structure layer, a light emitting structure layer and an encapsulation structure layer which are sequentially stacked on the substrate, wherein the circuit structure layer includes a pixel driving circuit, the light emitting structure layer includes a plurality of light emitting elements which may be OLED devices and connected with the pixel driving circuit, and the encapsulation structure layer may include a first inorganic package layer, an organic package layer and a second inorganic package layer which are stacked in sequence.

In some exemplary embodiments, the sensor may include a circuit layer, a piezoelectric layer and a first electrode which are sequentially stacked on a base substrate. The circuit layer includes a second electrode, the piezoelectric layer is disposed on a side of the second electrode facing away from the base substrate, and the first electrode is disposed on a side of the piezoelectric layer facing away from the second electrode. A surface of the base substrate facing away from the circuit layer is fixed on the side of the display panel facing away from the display side by the shading adhesive layer. In an example of this embodiment, the circuit layer may further include a plurality of thin film transistors (TFT's) arrayed on the base substrate and lines connecting the plurality of thin film transistors. In this example, the piezoelectric layer can generate and emit ultrasonic waves under a potential difference between the first electrode and the second electrode, and the piezoelectric layer can also receive the reflected ultrasonic waves and convert them into electrical signals that are transmitted to control devices (such as driving chips) to identify fingerprints, after being amplified by the circuit layer.

In some exemplary embodiments as shown in FIG. 4, the ultrasonic fingerprint module may further include a circuit board 22, wherein the circuit board 22 includes a binding portion 221 bound and connected with the sensor 21, and the second opening 321 may further expose the binding portion 221, thus preventing the light shielding sheet 32 from contacting with the binding portion 221, thereby avoiding affecting a performance of the ultrasonic fingerprint module. As an example, the circuit board 22 may be a flexible circuit board 22, a binding portion 221 of the circuit board 22 may be located at one end of the circuit board 22, the other end of the circuit board 22 protrudes from the first opening 121 and may be configured to be connected with a circuit on the display panel 11 or with a mainboard of a display device including the display module. In an example of this embodiment, the ultrasonic fingerprint module may further include a driving chip which can be disposed on the circuit board 22, and the sensor 21 may be controlled by the driver chip. For example, the driver chip may provide a control signal to the sensor 21 so that the sensor 21 emits ultrasonic waves. Furthermore, the driver chip also receives an electrical signal converted by the sensor 21 from the reflected ultrasonic signals to identify fingerprints.

Figure 5:
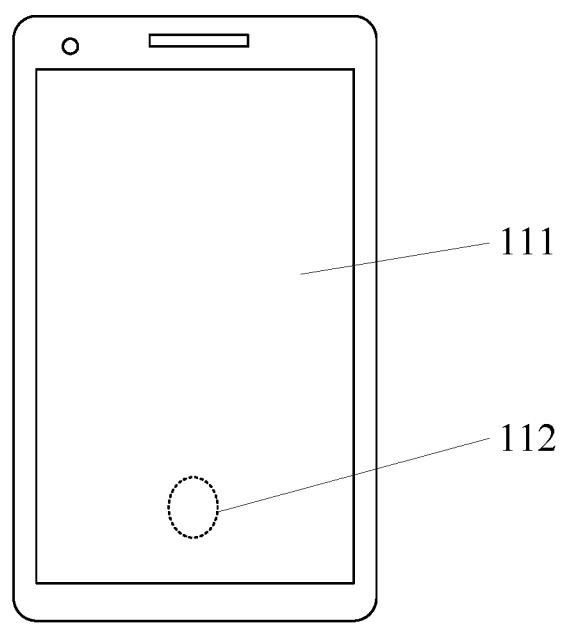
FIG. 5 is a schematic diagram from a display side of a structure of a display device according to some exemplary embodiments.

In some exemplary embodiments, as shown in FIG. 5, FIG. 5 is a schematic diagram from a display side of a structure of a display device of some exemplary embodiments, wherein the display device includes the display module described in the embodiments of the present disclosure. The display panel includes a display area 111, and the display area 111 includes a fingerprint identification area 112. The fingerprint identification area 112 corresponds to the sensor location. When a finger touches the fingerprint identification area 112 on the display side of the display panel, the ultrasonic fingerprint module can identify a fingerprint.

A display device is further provided in an embodiment of the present disclosure, which includes the display module described in any of the aforementioned embodiments. The display device may be a mobile phone as shown in FIG. 5, or any product or component with a display function, such as a tablet, a television, a display, a laptop computer, a digital photo frame, or a navigator.

In the accompanying drawings, a size of a constituent element, and a thickness of a layer or an area are sometimes exaggerated for clarity. Therefore, one implementation of the present disclosure is not necessarily limited to the size, and the shape and size of each component in the drawings do not reflect an actual scale. In addition, the drawings schematically illustrate some examples, and one implementation of the present disclosure is not limited to the shapes or numerical values shown in the drawings.

In the description herein, orientation or position relationships indicated by the terms such as "upper", "lower", "left", "right", "top", "inside", "outside", "axial", "tetragonal" and the like are orientation or position relationships shown in the drawings, and are intended to facilitate description of the embodiments of the present disclosure and simplification of the description, but not to indicate or imply that the mentioned structure has a specific orientation or be constructed and operated in a specific orientation, therefore, they should not be understood as limitations on the present disclosure.

In the description herein, unless otherwise specified and defined explicitly, the terms "connection", "fixed connection", "installation" and "assembly" should be understood in a broad sense, and, for example, may be a fixed connection, a detachable connection or an integrated connection; the terms "installation", "connection" and "fixed connection" may be a direct connection, an indirect connection through intermediate components, or communication inside two components. For those ordinarily skilled in the art, meanings of the above terms in the embodiments of the present disclosure can be understood according to situations.

The invention claimed is:

1. A display module, comprising a display panel, a heat dissipation film disposed on a side of the display panel facing away from a display side, and an ultrasonic fingerprint module wherein:
   the heat dissipation film is provided with a first opening, and the ultrasonic fingerprint module comprises a sensor which is disposed in the first opening and fixed on the side of the display panel facing away from the display side by a shading adhesive layer;
   the display module further comprises a light shielding sheet that is attached to a side of the heat dissipation film facing away from the display panel, wherein the light shielding sheet is provided with a second opening which exposes the sensor, and an orthographic projection of the light shielding sheet and the shading adhesive layer on the display panel comprises an orthographic projection of the first opening on the display panel; and
   a circumferential edge of the shading adhesive layer protrudes from the sensor, and an area of the light shielding sheet close to the second opening is attached to a portion of the shading adhesive layer protruding from the sensor.

2. The display module of claim 1, wherein a gap is formed between the circumferential edge of the shading adhesive layer and a wall of the first opening.

3. The display module of claim 1, wherein the ultrasonic fingerprint module further comprises a circuit board which comprises a binding portion bound to the sensor, and the second opening further exposes the binding portion.

4. The display module of claim 1, wherein a thickness of the heat dissipation film is d1, and a total thickness of the sensor and the shading adhesive layer is d2, where d1>d2, and a difference between d1 and d2 ranges from 0.03 mm to 0.15 mm.

5. The display module of claim 1, wherein the sensor comprises a circuit layer, a piezoelectric layer and a first electrode which are sequentially stacked on a base substrate, the circuit layer comprises a second electrode, the piezoelectric layer is disposed on a side of the second electrode facing away from the base substrate, and the first electrode is disposed on a side of the piezoelectric layer facing away from the second electrode; a surface of the base substrate facing away from the circuit layer is fixed on the side of the display panel facing away from the display side by the shading adhesive layer.

6. The display module of claim 1, wherein heat dissipation layer comprises an adhesive layer, a buffer layer, and a metal layer which are sequentially stacked, and the adhesive layer is adhered to the side of the display module facing away from the display side.

7. The display module of claim 1, wherein a shape of the first opening is a circle, a rectangle or an ellipse.

8. The display module of claim 1, wherein the display panel comprises a display area which comprises a fingerprint identification area that corresponds to a position of the sensor.

9. A display device, comprising the display module of claim 1.

10. The display module of claim 2, wherein the sensor comprises a circuit layer, a piezoelectric layer and a first electrode which are sequentially stacked on a base substrate, the circuit layer comprises a second electrode, the piezoelectric layer is disposed on a side of the second electrode facing away from the base substrate, and the first electrode is disposed on a side of the piezoelectric layer facing away from the second electrode; a surface of the base substrate facing away from the circuit layer is fixed on the side of the display panel facing away from the display side by the shading adhesive layer.

11. The display module of claim 3, wherein the sensor comprises a circuit layer, a piezoelectric layer and a first electrode which are sequentially stacked on a base substrate, the circuit layer comprises a second electrode, the piezoelectric layer is disposed on a side of the second electrode facing away from the base substrate, and the first electrode is disposed on a side of the piezoelectric layer facing away from the second electrode; a surface of the base substrate facing away from the circuit layer is fixed on the side of the display panel facing away from the display side by the shading adhesive layer.

12. The display module of claim 4, wherein the sensor comprises a circuit layer, a piezoelectric layer and a first electrode which are sequentially stacked on a base substrate, the circuit layer comprises a second electrode, the piezoelectric layer is disposed on a side of the second electrode facing away from the base substrate, and the first electrode is disposed on a side of the piezoelectric layer facing away from the second electrode; a surface of the base substrate facing away from the circuit layer is fixed on the side of the display panel facing away from the display side by the shading adhesive layer.

13. The display module of claim 2, wherein heat dissipation layer comprises an adhesive layer, a buffer layer, and a metal layer which are sequentially stacked, and the adhesive layer is adhered to the side of the display module facing away from the display side.

14. The display module of claim 3, wherein heat dissipation layer comprises an adhesive layer, a buffer layer, and a metal layer which are sequentially stacked, and the adhesive layer is adhered to the side of the display module facing away from the display side.

15. The display module of claim 4, wherein heat dissipation layer comprises an adhesive layer, a buffer layer, and a metal layer which are sequentially stacked, and the adhesive layer is adhered to the side of the display module facing away from the display side.

* * * * *